(12) United States Patent
Sangu et al.

(10) Patent No.: US 10,991,580 B2
(45) Date of Patent: Apr. 27, 2021

(54) LASER CRYSTALLIZING APPARATUS

(71) Applicant: SAMSUNG DISPLAY CO., LTD., Yongin-si (KR)

(72) Inventors: Akifumi Sangu, Hwaseong-si (KR); Gyoowan Han, Yongin-si (KR); Jekil Ryu, Yongin-si (KR); Kyungjae Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 183 days.

(21) Appl. No.: 16/204,850

(22) Filed: Nov. 29, 2018

(65) Prior Publication Data

US 2019/0172713 A1 Jun. 6, 2019

(30) Foreign Application Priority Data

Dec. 5, 2017 (KR) .................. 10-2017-0166165

(51) Int. Cl.
*B23K 26/064* (2014.01)
*H01L 21/02* (2006.01)
(Continued)

(52) U.S. Cl.
CPC .... *H01L 21/02678* (2013.01); *B23K 26/0006* (2013.01); *B23K 26/032* (2013.01);
(Continued)

(58) Field of Classification Search
CPC ... B23K 26/064; B23K 26/352; B23K 26/354
See application file for complete search history.

(56) References Cited

U.S. PATENT DOCUMENTS

| 5,609,780 A | 3/1997 | Freedenberg et al. |
| 6,369,356 B1 | 4/2002 | Beck et al. |
| (Continued) | | |

FOREIGN PATENT DOCUMENTS

| CN | 108461421 | 8/2018 |
| EP | 3340402 | 9/2018 |
| (Continued) | | |

OTHER PUBLICATIONS

European Search Report for Application Serial No. 18210295.4 dated Apr. 24, 2019.

*Primary Examiner* — Errol V Fernandes
(74) *Attorney, Agent, or Firm* — F. Chau & Associates, LLC

(57) ABSTRACT

A laser crystallizing apparatus includes a first light source unit configured to emit a first input light having a linearly polarized laser beam shape. A second light source unit is configured to emit a second input light having a linearly polarized laser beam shape. A polarization optical system is configured to rotate the first input light and/or the second input light at a predetermined rotation angle. An optical system is configured to convert the first input light and the second input light, which pass through the polarization optical system, into an output light. A target substrate is seated on a stage and output light is directed onto the target substrate. A monitoring unit is configured to receive the first input light or the second input light from the polarization optical system and measure a laser beam quality thereof.

20 Claims, 8 Drawing Sheets

(51) Int. Cl.

| | |
|---|---|
| *G02B 27/28* | (2006.01) |
| *G01J 1/42* | (2006.01) |
| *G02B 27/10* | (2006.01) |
| *H01L 27/12* | (2006.01) |
| *B23K 26/067* | (2006.01) |
| *H01L 21/67* | (2006.01) |
| *B23K 26/03* | (2006.01) |
| *B23K 26/08* | (2014.01) |
| *B23K 26/70* | (2014.01) |
| *B23K 26/352* | (2014.01) |
| *B23K 26/06* | (2014.01) |
| *B23K 26/354* | (2014.01) |
| *B23K 26/00* | (2014.01) |
| *B23K 101/40* | (2006.01) |
| *B23K 103/00* | (2006.01) |

(52) U.S. Cl.
CPC .......... *B23K 26/064* (2015.10); *B23K 26/067* (2013.01); *B23K 26/0608* (2013.01); *B23K 26/0652* (2013.01); *B23K 26/0853* (2013.01); *B23K 26/352* (2015.10); *B23K 26/354* (2015.10); *B23K 26/705* (2015.10); *G01J 1/4257* (2013.01); *G02B 27/106* (2013.01); *G02B 27/108* (2013.01); *G02B 27/283* (2013.01); *G02B 27/286* (2013.01); *H01L 21/02532* (2013.01); *H01L 21/02592* (2013.01); *H01L 21/67115* (2013.01); *H01L 27/1222* (2013.01); *H01L 27/1285* (2013.01); *B23K 2101/40* (2018.08); *B23K 2103/50* (2018.08)

(56) References Cited

U.S. PATENT DOCUMENTS

| | | |
|---|---|---|
| 2004/0203219 A1 | 10/2004 | Kasahara et al. |
| 2017/0087664 A1* | 3/2017 | Cho .................. G02B 27/0905 |
| 2018/0174833 A1 | 6/2018 | Aslanov et al. |

FOREIGN PATENT DOCUMENTS

| | | |
|---|---|---|
| JP | 2007-059458 | 3/2007 |
| KR | 10-2005-0078411 | 8/2005 |
| KR | 10-2006-0122641 | 11/2006 |
| KR | 10-1733032 | 4/2017 |
| KR | 10-2017-0051613 | 5/2017 |
| KR | 10-2018-0072906 | 7/2018 |
| KR | 10-2018-0089844 | 8/2018 |

* cited by examiner

LASER CRYSTALLIZING APPARATUS

CROSS-REFERENCE TO RELATED APPLICATIONS

This U.S. non-provisional patent application claims priority under 35 U.S.C. § 119 of Korean Patent Application No. 10-2017-0166165, filed on Dec. 5, 2017, the entire contents of which are hereby incorporated by reference.

TECHNICAL FIELD

The present disclosure relates to crystallizing, and more particularly, to a laser crystallizing apparatus.

DISCUSSION OF THE RELATED ART

In general, electric and electronic devices such as display devices are driven by thin film transistors. These thin film transistors may include crystalline silicon as an active layer thereof. Crystalline silicon may be well suited for use as an active layer in a thin film transistor owing to its high mobility. To provide the crystalline silicon active layer, an amorphous polycrystalline thin film, for example, an amorphous silicon thin film may be crystalized. A laser may be used to crystallize the amorphous silicon thin film into a crystalline silicon thin film. However, while the laser is irradiating the amorphous silicon, even small changes in the laser characteristics can degrade crystallization quality.

SUMMARY

A laser crystallizing apparatus includes a first light source unit configured to emit a first input light having a linearly polarized laser beam shape. A second light source unit is configured to emit a second input light having a linearly polarized laser beam shape. A polarization optical system is configured to rotate the first input light and/or the second input light at a predetermined rotation angle. An optical system is configured to convert the first input light and the second input light, which pass through the polarization optical system, into an output light. A target substrate is seated on a stage and output light is directed onto the target substrate. A monitoring unit is configured to receive the first input light or the second input light from the polarization optical system and measure a laser beam quality thereof.

A laser crystallizing apparatus includes a first light source unit configured to emit a first input light having a laser beam shape and a first polarized state. A second light source unit is configured to emit a second input light having a laser beam shape and the first polarized state. A first input polarization rotator is configured to convert the first input light into a second polarized state different from the first polarized state. A second input polarization rotator is configured to maintain the first polarized state of the second input light. A first output polarization rotator is configured to convert the second polarized state of the first input light passing through the first input polarization rotator into the first polarized state. A second output polarization rotator is configured to maintain the first polarized state of the second input light passing through the second input polarization rotator. An optical system is configured to convert the first input light and the second input light, which pass through the first and second output polarization rotators, into an output light. A target substrate is seated on a stage and the output light is directed to the target substrate. A polarization plate is configured to block one of, and transmit another of, the first input light having the second polarized state, which passes through the first input polarization rotator, and the second input light having the first polarized state, which passes through the second input polarization rotator. A monitoring unit is configured to measure a laser beam quality by using the light passing through the polarization plate.

A method for crystalizing amorphous silicon includes emitting a first laser beam from a first laser beam emitter. A second laser beam is emitted from a second laser beam emitter. The first laser beam is split into a first sub-beam and a second sub-beam. The second laser beam is split into a third sub-beam and a fourth sub-beam. A first beam quality is calculated from the first sub-beam. A second beam quality is calculated from the third sub-beam. The second sub-beam and the fourth sub-beam are directed through an optical system. Amorphous silicon is crystalized using an output of the optical system.

BRIEF DESCRIPTION OF THE FIGURES

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
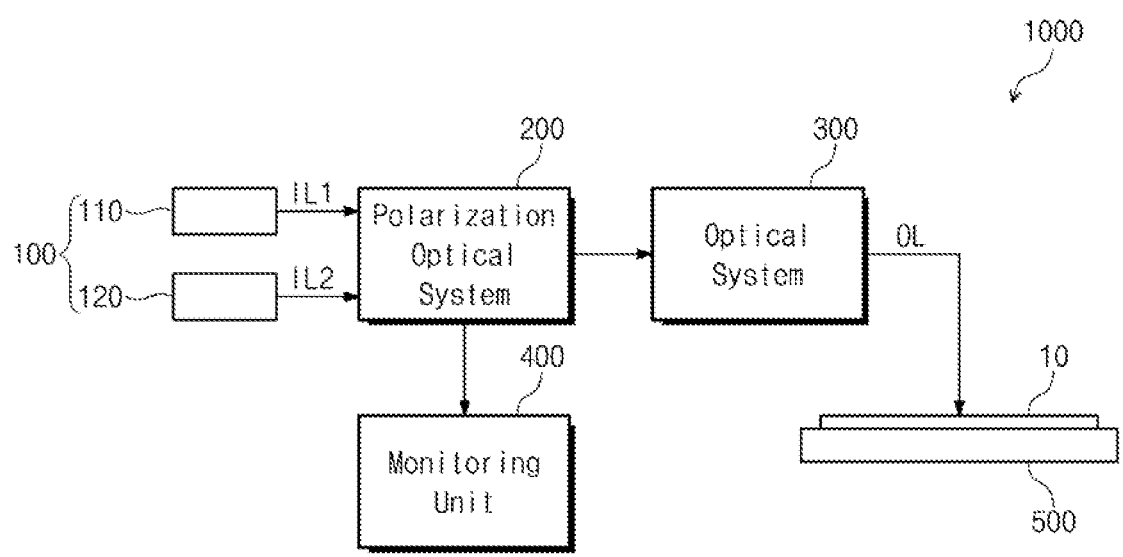
FIG. 1 is a schematic diagram illustrating a laser crystallizing apparatus according to an exemplary embodiment of the inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. Like reference numerals may refer to like elements throughout the specification and figures.

It will also be understood that when a layer is referred to as being "on" another layer or substrate, it can be directly on the other layer or substrate, or intervening layers may also be present.

Spatially relative terms, such as "below", "beneath", "lower", "above", "upper" and the like, may be used herein for ease of description to describe one element or feature's relationship to another element(s) or feature(s) as illustrated in the figures. The spatially relative terms should be understood as terms which include different directions of configurative elements in addition to directions illustrated in the figures when using or operating the inventive concept.

It will be understood that although the terms of first and second are used herein to describe various elements and/or sections, these elements and/or sections should not be limited by these terms. These terms are only used to distinguish one element, component, or section from another element, component, or section. Accordingly, a first element, a first component, or a first section that will be described below may be a second element, a second component, or a second section within the technical idea of the present disclosure.

Hereinafter, exemplary embodiments of the inventive concept will be described below in more detail with reference to the accompanying drawings.

FIG. 1 is a schematic diagram illustrating a laser crystallizing apparatus according to an exemplary embodiment of the inventive concept.

Referring to FIG. 1, a laser crystallizing apparatus 1000, according to an exemplary embodiment of the inventive concept, may include a light source unit 100, a polarization optical system 200, an optical system 300, a monitoring unit 400, and a stage 500.

In an exemplary embodiment of the inventive concept, the light source unit 100 may include multiple light source units. For example, light source unit 100 may include two or more light source units each emitting different wavelength bands to provide a larger depth of spectra or each light source unit may emit the same wavelength bands to increase total power.

The light source unit 100 may include at least a first light source unit 110 and a second light source unit 120. The first light source unit 110 may emit a first input light IL1, and the second light source unit 120 may emit a second input light IL2. The first input light IL1 and the second input light IL2 may each be linearly polarized light. For example, the first input light IL1 and the second input light IL2 may be P-polarized light or S-polarized light. In an exemplary embodiment of the inventive concept, the first input light IL1 and the second input light IL2 are the P-polarized light. However, other arrangements may be used.

Although the light source unit including the two light source units is illustrated in FIG. 1 as an example, the inventive concept is not limited thereto. For example, the light source unit 100 may include three or more light source units.

Each of the first light source unit 110 and the second light source unit 120 may be a solid-state laser generator that outputs linearly polarized light.

The polarization optical system 200 provides one of the first and second input light IL1 and IL2 emitted from the first and second light source units 110 and 120 to the monitoring unit 400 and provides both of the lights IL1 and 112 emitted from the first and second light source units 110 and 120 to the optical system 300. The polarization optical system 200 may rotate at least one of the first and second input light IL1 and IL2 at a predetermined rotation angle. The polarization optical system 200 may rotate at least one of the first and second input light IL1 and IL2 two times or more at a predetermined rotation angle. The predetermined rotation angle may be about 90 degrees.

The optical system 300 converts the light incident from the polarization optical system 200 into output light OL. The optical system 300 may be disposed between the stage 500 and the light source unit 100 along an optical path to direct an output light OL onto the stage 500. The output light OL may have the same polarized state as the first and second input light IL1 and IL2. Thus, when each of the first and second input light IL1 and IL2 has a P-polarized state, the output light OL may also have the P-polarized state.

The monitoring unit 400 may be configured to measure qualities of the laser light incident from the polarization optical system 200. The monitoring unit 400 may measure qualities according to the optical path of the laser light.

The stage 500 supports a target substrate 10. The output light OL emitted from the optical system 300 may be directed onto the target substrate 10. The output light OL may crystallize a thin film formed on a top surface of the target substrate 10.

For example, the target substrate 10 may include an amorphous silicon layer. The target substrate 10 may be formed through a low pressure chemical vapor deposition method, an atmospheric pressure chemical vapor deposition method, a plasma enhanced chemical vapor deposition (PECVD) method, a sputtering method, or a vacuum evaporation method. The laser crystallizing apparatus 1000, according to an exemplary embodiment of the inventive concept, may direct the output light OL onto the target substrate 10 to crystallize the amorphous silicon layer of the target substrate 10 into a poly-crystal silicon layer.

The laser crystallizing apparatus 1000, according to an exemplary embodiment of the inventive concept, may further include a stage moving unit disposed on a lower portion or on a side surface of the stage 500 to move the stage 500 so that the output light OL may be scanned across a desired region of the target substrate 10.

The laser crystallizing apparatus 1000, according to an exemplary embodiment of the inventive concept, may further include at least one reflection member disposed between the optical system 300 and the stage 500 on the optical path. For example, the reflection member may be a mirror. The reflection member may change a direction of the output light OL so that the output light OL provided from the optical system 300 is directed to the stage 500.

Figure 2:
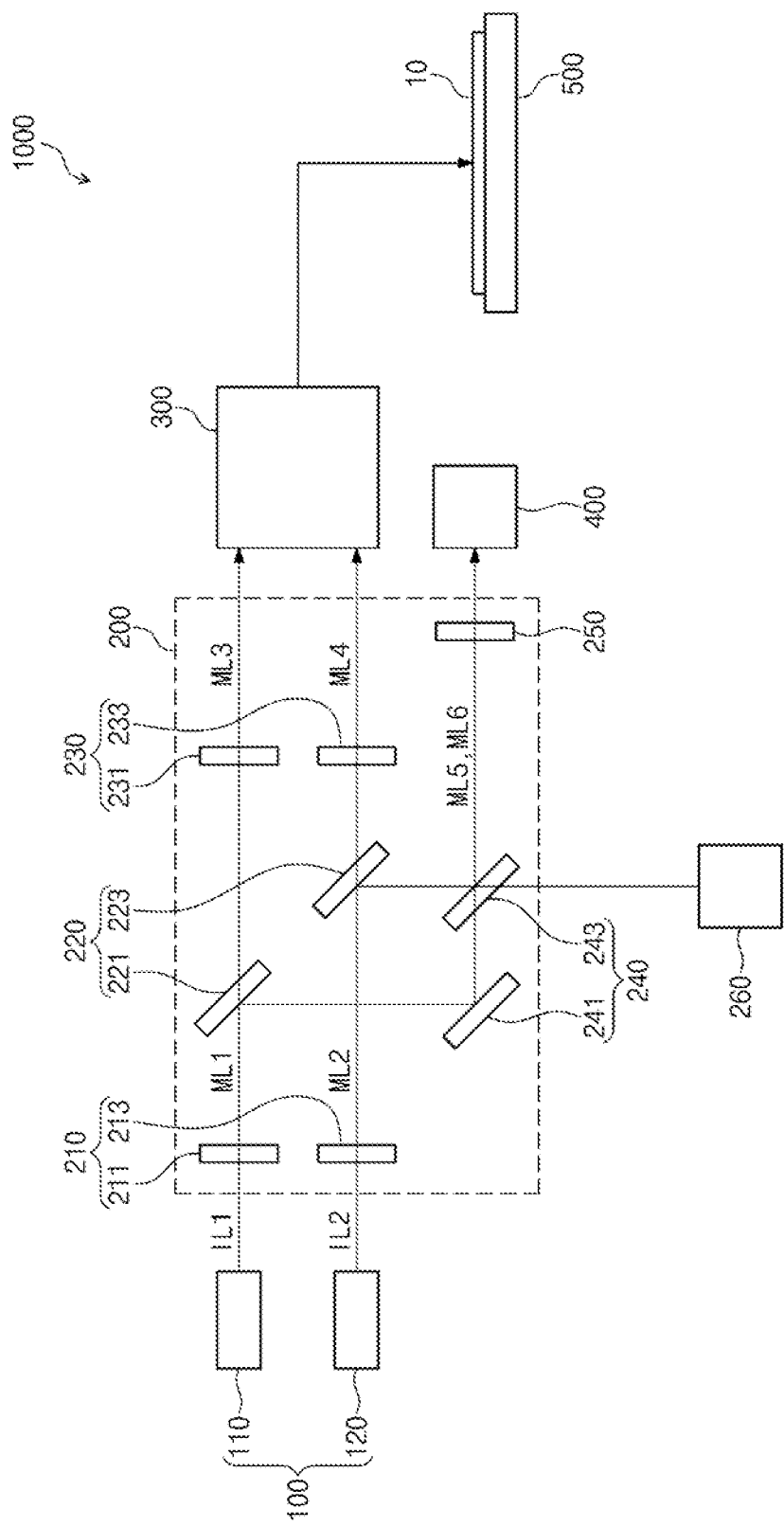
FIG. 2 is a schematic diagram illustrating a polarization optical system of FIG. 1 according to an exemplary embodiment of the inventive concept.

FIG. 2 is a schematic diagram illustrating the polarization optical system of FIG. 1 according to an exemplary embodiment of the inventive concept.

Referring to FIG. 2, the polarization optical system 200 may include an input polarization rotator 210, a beam splitter 220, an output polarization rotator 230, a direction switching member 240, and a polarization plate 250.

The input polarization rotator 210 may include a first input polarization rotator 211 and a second input polarization rotator 213. The first input polarization rotator 211 is disposed on the optical path of the first input light IL1, and the first input light IL1 passes through the first input polarization rotator 211. The first input light IL1 passing through the first input polarization rotator 211 may be defined as first middle light ML1. The second input polarization rotator 213 is disposed on the optical path of the second input light IL2, and the second input light IL2 emitted from the second light source unit 120 passes through the second input polarization rotator 213. The second input light IL2 passing through the second input polarization rotator 213 may be defined as second middle light ML2. Each of the first and second input polarization rotators 211 and 213 may be a faraday rotator or a half-wave plate.

The first input polarization rotator 211 and the second input polarization rotator 213 may rotate at least one polarized state of the incident first and second input light IL1 and IL2 at a predetermined rotation angle. The first middle light ML1 and the second middle light ML2 may have polarized state different from each other. For example, when all the first and second input lights IL1 and IL2 emitted from the first light source unit 110 and the second light source unit 120 are the P-polarized light, the first input light IL1 has the S-polarized state after passing through the first input polarization rotator 211, and the second input light IL2 may have the P-polarized state after passing through the second input polarization rotator 213.

The light passing through the first and second input polarization rotators 211 and 213 may have polarization axes that are perpendicular to each other. In an exemplary embodiment of the inventive concept, optical axes of the first input polarization rotator 211 and the second input polarization rotator 213 may be perpendicular to each other. However, the inventive concept is not limited thereto. For example, the axes of the first input polarization rotator 211 and the second input polarization rotator 213 may have an angle of about 45 degree therebetween, and one of the first input polarization rotator 211 and the second input polarization rotator 213 may rotate an angle between the polarization axis of the incident light and the optical axis two times.

The beam splitter 220 may include a first beam splitter 221 and a second beam splitter 223.

The first beam splitter 221 may be disposed on the optical path of the first input light IL1 and the first middle light ML1. The first beam splitter 221 transmits a portion of the first middle light ML1 and reflects a remaining portion of the first middle light ML1.

The second beam splitter 223 may be disposed on the optical path of the second input light IL2 and the second middle light ML2. The second beam splitter 223 transmits a portion of the second middle light ML2 and reflects a remaining portion of the second middle light ML2.

The output polarization rotator 230 may include a first output polarization rotator 231 and a second output polarization rotator 233.

The first output polarization rotator 231 is disposed on the optical path of the first middle light ML1, and the first middle light ML1 passes through the first output polarization rotator 231. The first middle light ML1 passing through the first output polarization rotator 231 may be defined as third middle light ML3.

The second output polarization rotator 233 is disposed on the optical path of the second middle light ML2, and the second middle light ML2 passes through the second output polarization rotator 233. The second middle light ML2 passing through the second output polarization rotator 233 may be defined as fourth middle light ML4. Each of the first and second output polarization rotators 231 and 233 may be one of a faraday rotator and a half-wave plate.

The second input polarization rotator 213 and the second output polarization rotator 233 may rotate at least one polarized state of the incident third and fourth middle light ML3 and ML4 at a predetermined rotation angle.

The light passing through the first and second output polarization rotators 231 and 233 may have the same polarization axis. The polarized states of the input light IL1 and IL2 emitted from the first and second light source units 110 and 120 and the polarized states of the third and fourth middle light ML3 and ML4 passing through the first and second output polarization rotators 231 and 233 may be the same. The optical axes of the first and second output polarization rotators 231 and 233 may be variously set according to the rotation angle between the optical axes of the first and second input polarization rotators 211 and 213 and the polarization axis of the incident light. For example, the optical axes of the first input polarization rotator 211 and the first output polarization rotator 231 may be the same. The optical axes of the second input polarization rotator 213 and the second output polarization rotator 233 may be the same. The first and second output polarization rotators 231 and 233 may have optical axes that are perpendicular to each other or have an angle of about 45 degrees therebetween.

The direction switching member 240 may include a first direction switching member 241 and a second direction switching member 243. The first direction switching member 241 may change a path of light reflected by the first beam splitter 221.

The second direction switching member 243 may change a path of light reflected by the second beam splitter 223.

Each of the first direction switching member 241 and the second direction switching member 243 may be realized by using a mirror or a beam splitter. In FIG. 2, the first direction switching member 241 may be the mirror, and the second direction switching member 243 may be the beam splitter. Here, the laser crystallizing apparatus 1000 may further include a first beam dump 260. As the second direction switching member 243 may be a beam splitter, a part of the light incident thereupon may be transmitted. Accordingly, the first beam dump 260 may be configured to absorb the transmitted light of the second middle light ML2.

In an exemplary embodiment of the inventive concept, the first and second direction switching members 241 and 243 may be omitted.

The polarization plate 250 may be disposed on the optical path of the first and second middle light ML1 and ML2 defined by the first and second beam splitters 221 and 223 and the first and second direction switching members 241 and 243. Portions of the first and second middle light ML1 and ML2 may be incident into the polarization plate 250, and portions of the first and second middle light ML1 and ML2 incident into the polarization plate 250 may be defined as fifth and sixth middle light ML5 and ML6. Thus, the first middle light ML1 and the fifth middle light ML5 may have the same polarized state, while the second middle light ML2 and the sixth middle light ML6 may have the same polarized state.

The polarization plate 250 may transmit one of the S-polarized light and the P-polarized light and/or block the other one of the S-polarized light and the P-polarized light. Thus, one of the fifth and sixth middle light ML5 and ML6 may be transmitted through the polarization plate 250, while the other one may not be transmitted through the polarization plate 250. For example, the polarization axis of the polarization plate 250 may be set to transmit the P-polarized light. When all the first and second input light IL1 and IL2 have the P-polarized state, the first input light IL1 may be changed into the S-polarized light while passing through the first input polarization rotator 211 and thus be blocked by the polarization plate 250. The second input light IL2 may pass through the second input polarization rotator 213 to maintain the P-polarized state and thereby to pass through the polarization plate 250. When the optical axes of the first and second input polarization rotators 211 and 213 are changed, a portion of the first input light IL1 may be transmitted through the polarization plate 250, while a portion of the second input light IL2 may be blocked by the polarization plate 250.

Laser light may be characterized by a beam quality factor, also called a propagation factor or $M^2$ factor. An ideal laser beam has an $M^2$ factor of 1. Since a laser beam waist value having the smallest radius of the laser beam is proportional to the $M^2$ factor, the smaller the $M^2$ factor of the laser beam, the better the qualities of the laser beam. The $M^2$ factor of the laser light emitted from the first and second light source units 110 and 120 may be controlled to increase or decrease through a design of the optical system 300. However, a change of the $M^2$ factor of either of the first and second input light IL1 and IL2 during the process may result in degraded laser crystallization quality. Thus, exemplary embodiments of the inventive concept may continuously monitor the first and second input light IL1 and IL2 so as to have a constant $M^2$ factor.

The monitoring unit 400 may measure laser beam qualities of one of the fifth middle light ML5 and the sixth middle light ML6. Particularly, the monitoring unit 400 may continuously measure an $M^2$ factor of one of the fifth middle light ML5 and the sixth middle light ML6.

The laser crystallizing apparatus 1000 may further include a feedback unit. The feedback unit may continuously receive the results obtained by measuring the $M^2$ factor of one of the fifth middle light ML5 and the sixth middle light ML6 from the monitoring unit 400 and may also output a feedback signal when the received value is different from a reference value. The feedback signal may be an alarm, a warning message on a separate screen, or the like.

In an exemplary embodiment of the inventive concept, the $M^2$ factor is measured of each of the laser light beams emitted from the first light source unit 110 and the second light source unit 120. This is preferred over measuring the $M^2$ factor of the combined laser light emitted from the first light source unit 110 and the second light source unit 120 because it is desired to know where the source of the abnormality is so that remedial actions may be taken.

In an exemplary embodiment of the inventive concept, the polarization optical system 200 may selectively provide one of the beams emitted from the first light source unit 110 and the second light source unit 120 to the monitoring unit 400 to selectively measure the $M^2$ factor of the laser light emitted from the first light source unit 110 and the second light source unit 120.

Figure 3:
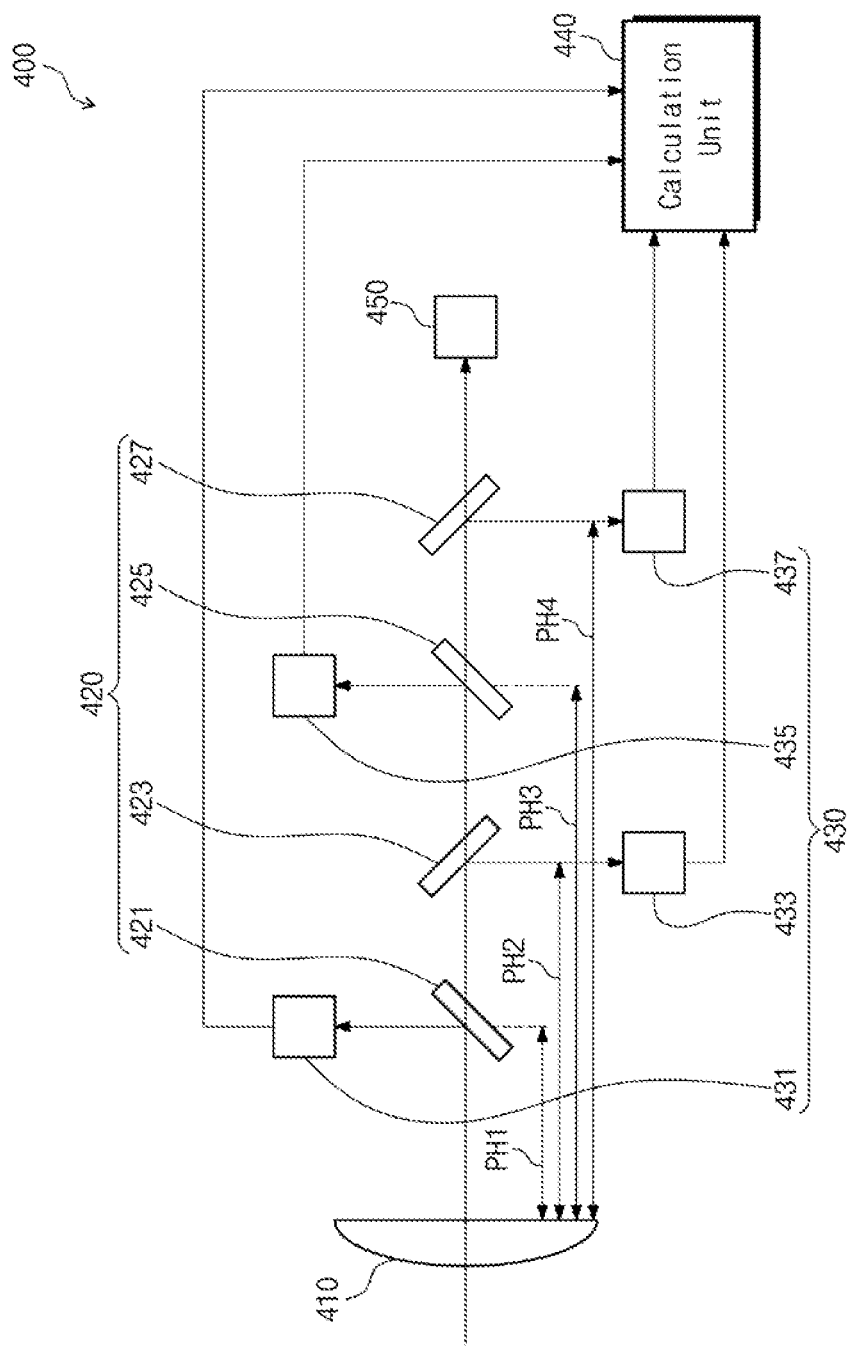
FIG. 3 is a schematic diagram illustrating a monitoring unit of FIG. 2 according to an exemplary embodiment of the inventive concept.

FIG. 3 is a schematic diagram illustrating the monitoring unit of FIG. 2 according to an exemplary embodiment of the inventive concept.

Referring to FIG. 3, the monitoring unit 400 may include a focus lens 410, a sensor beam splitter 420, an image sensor 430, and a calculation unit 440.

The fifth middle light ML5 or the sixth middle light ML6 passing through the polarization plate 250 may be defined as sensing light SL.

The focus lens 410 may adjust an intensity and focus of the sensing light SL.

The sensor beam splitter 420 may include a plurality of beam splitters. In an exemplary embodiment of the inventive concept, the sensor beam splitter 420 may include first to fourth sensor beam splitters 421, 423, 425, and 427.

The first to fourth sensor beam splitters 421, 423, 425, and 427 may be disposed on an optical path of the sensing light SL to transmit a portion of the sensing light SL and reflect a remaining portion of the sensing light SL. The first to fourth sensor beam splitters 421, 423, 425, and 427 may be successively disposed and spaced apart from each other along the optical path of the sensing light SL. For example, the first sensor beam splitter 421 may be disposed on a first optical path PH1, the second sensor beam splitter 423 may be disposed on a second optical path PH2, a third sensor beam splitter 425 may be disposed on a third optical path PH3, and a fourth sensor beam splitter 427 may be disposed on a fourth optical path PH4. The first to fourth optical paths PH1 to PH4 may be evenly spaced apart from each other.

In an exemplary embodiment of the inventive concept, the monitoring unit 400 may further include a second beam bump 450. The second beam bump 450 is disposed behind the fourth sensor beam splitter 427 on the optical path of the sensing light SL to absorb the light passing through the fourth sensor beam splitter 427.

The image sensor 430 may include first to fourth image sensors 431, 433, 435, and 437. The number of image sensors 430 may be substantially the same as the number of sensor beam splitters 420.

The first to fourth image sensors 431, 433, 435, and 437 may measure a laser width of the sensing light SL reflected by the first to fourth sensing beam splitters 421, 423, 425, and 427, respectively. The first to fourth image sensors 431, 433, 435, and 437 may measure the laser width according to the optical path of the sensing light SL. The first to fourth image sensors 431, 433, 435, and 437 may provide the measured laser width of the sensing light SL to the calculation unit 440.

In an exemplary embodiment of the inventive concept, although the monitoring unit 400 includes the four beam splitters 421, 423, 425, and 427 and the four image sensors 431, 433, 435, and 437, the inventive concept is not limited thereto. In an exemplary embodiment of the inventive concept, the monitoring unit 400 may include two or more beam splitters and two or more image sensors. The number of beam splitters may match the number of imaging sensors so that a beam splitter may correspond to each imaging sensor.

The calculation unit 440 may calculate the $M^2$ factor according to the laser width of the sensing light SL received from the first to fourth image sensors 431, 433, 435, and 437.

The monitoring unit 400, according to an exemplary embodiment of the inventive concept, may calculate the $M^2$ factor according to the optical path of the sensing light SL.

The monitoring unit 400 may measure the laser width of the sensing light SL in each of the first to fourth optical paths PH1 to PH4 to calculate the $M^2$ factor of the first input light IL1 or the second input light IL2.

Figure 4:
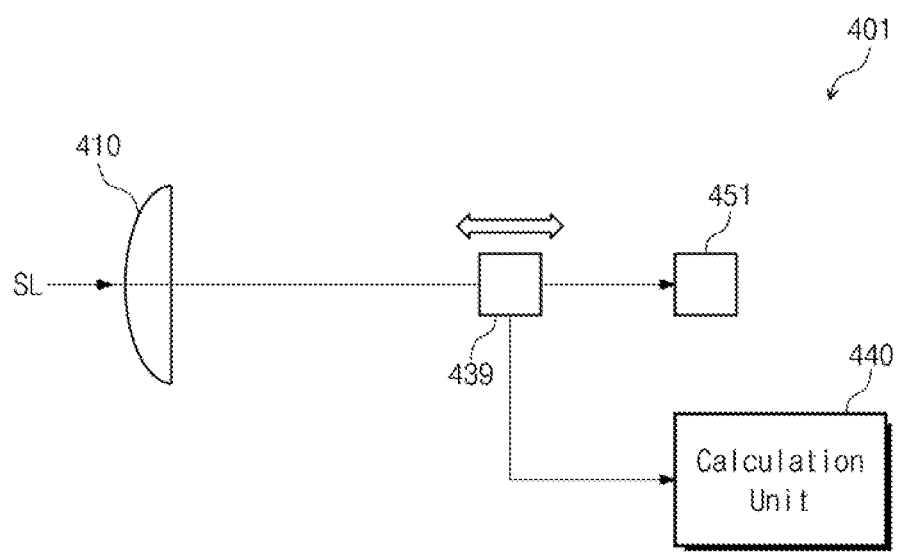
FIG. 4 is a schematic diagram illustrating a monitoring unit of FIG. 2 according to an exemplary embodiment of the inventive concept.

FIG. 4 is a schematic diagram illustrating the monitoring unit of FIG. 2 according to an exemplary embodiment of the inventive concept.

Referring to FIG. 4, the monitoring unit 401 may include a focus lens 410, a moving image sensor 439, and a calculation unit 440.

Fifth middle light ML5 or sixth middle light ML6 passing through a polarization plate 250 may be defined as sensing light SL.

The focus lens 410 may adjust an intensity and focus of the sensing light SL.

The moving image sensor 439 may measure a laser width of the sensing light SL. The moving image sensor 439 may move along an optical path of the sensing light SL. The moving image sensor 439 may measure a laser width according to a plurality of optical paths of the sensing light SL. The moving image sensor 439 provides the measured laser width of the sensing light SL to the calculation unit 440.

In an exemplary embodiment of the inventive concept, the monitoring unit 401 may further include a separate moving device for movement of the moving image sensor 439. The moving image sensor 439 may be fixed to the moving device to move along the optical path of the sensing light SL.

The monitoring unit 401 may further include a third beam dump 451. The third beam dump 451 may be disposed behind the moving image sensor 439 on the optical path of the sensing light SL to absorb light passing through the moving image sensor 439.

The calculation unit 440 may calculate an $M^2$ factor according to the laser width of the sensing light SL received from the moving image sensor 439.

Figure 5:
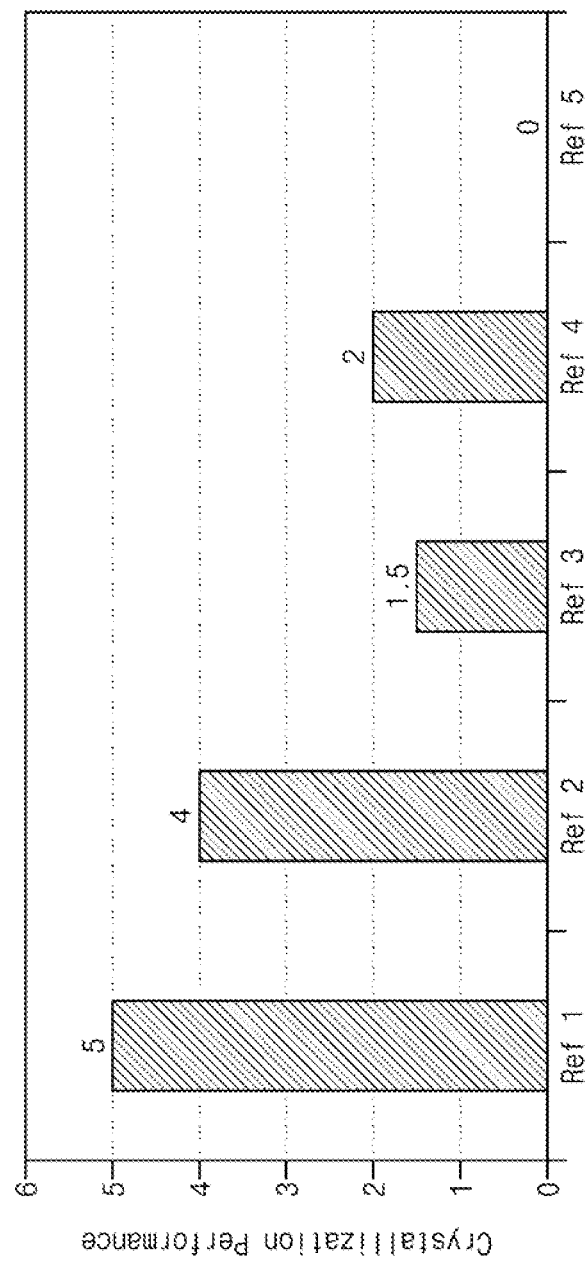
FIG. 5 is a graph illustrating simulation results obtained by measuring crystallization performance according to changes in intensity of laser light and an $M^2$ factor in the laser crystallizing apparatus.

FIG. 5 is a graph illustrating simulation results obtained by measuring crystallization performance according to changes in intensity of laser light and an $M^2$ factor in the laser crystallizing apparatus.

Referring to FIG. 5, Ref 1 represents crystallization performance of the laser crystallizing apparatus in an ideal case in which an intensity and an $M^2$ factor of the laser beam are not changed during a process progress time. Ref 2 represents crystallization performance of the laser crystallizing apparatus when the intensity of the laser light is changed by about ±5%, and the $M^2$ factor is not changed during the process progress time. Ref 3 represents crystallization performance of the laser crystallizing apparatus when the intensity of the laser light is not changed, and the $M^2$ factor is changed by about +5% during the process progress time. Ref 4 represents crystallization performance of the laser crystallizing apparatus when the intensity of the laser light is not changed, and the $M^2$ factor is changed by about −5% during the process progress time. Ref 5 represents crystallization performance of the laser crystallizing apparatus when the intensity of the laser light is changed by about +5%, and the $M^2$ factor is changed by about +5% during the process progress time.

The crystallization performance of Ref 1 to Ref 5 may have a value ranging from 0 to 6 (inclusive), and the crystallization performance is considered to be gradually better from 0 to 5.

When assuming that the crystallization performance of Ref 1 is 5, the crystallization performance of Ref 2 is 1.5, the crystallization performance of Ref 4 is 2, and the crystallization performance of Ref 5 is 0. For example, it is confirmed that the crystallization performance is more deteriorated when the $M^2$ factor of the laser beam is changed during the process progress time like the cases of Ref 3 and Ref 4 when compared with the case in which the intensity of the laser beam is changed during the process progress time like Ref 2. In the laser crystallizing apparatus, the $M^2$ factor is an important index.

In exemplary embodiments of the inventive concept, the laser crystallizing apparatus 1000 measures the $M^2$ factor of the laser light through the monitoring units 400 and 401 in the plurality of optical paths to monitor whether the $M^2$ factor is maintained constantly during the process progress time. Thus, the crystallization performance of the laser crystallizing apparatus 1000 may be managed.

Figure 6:
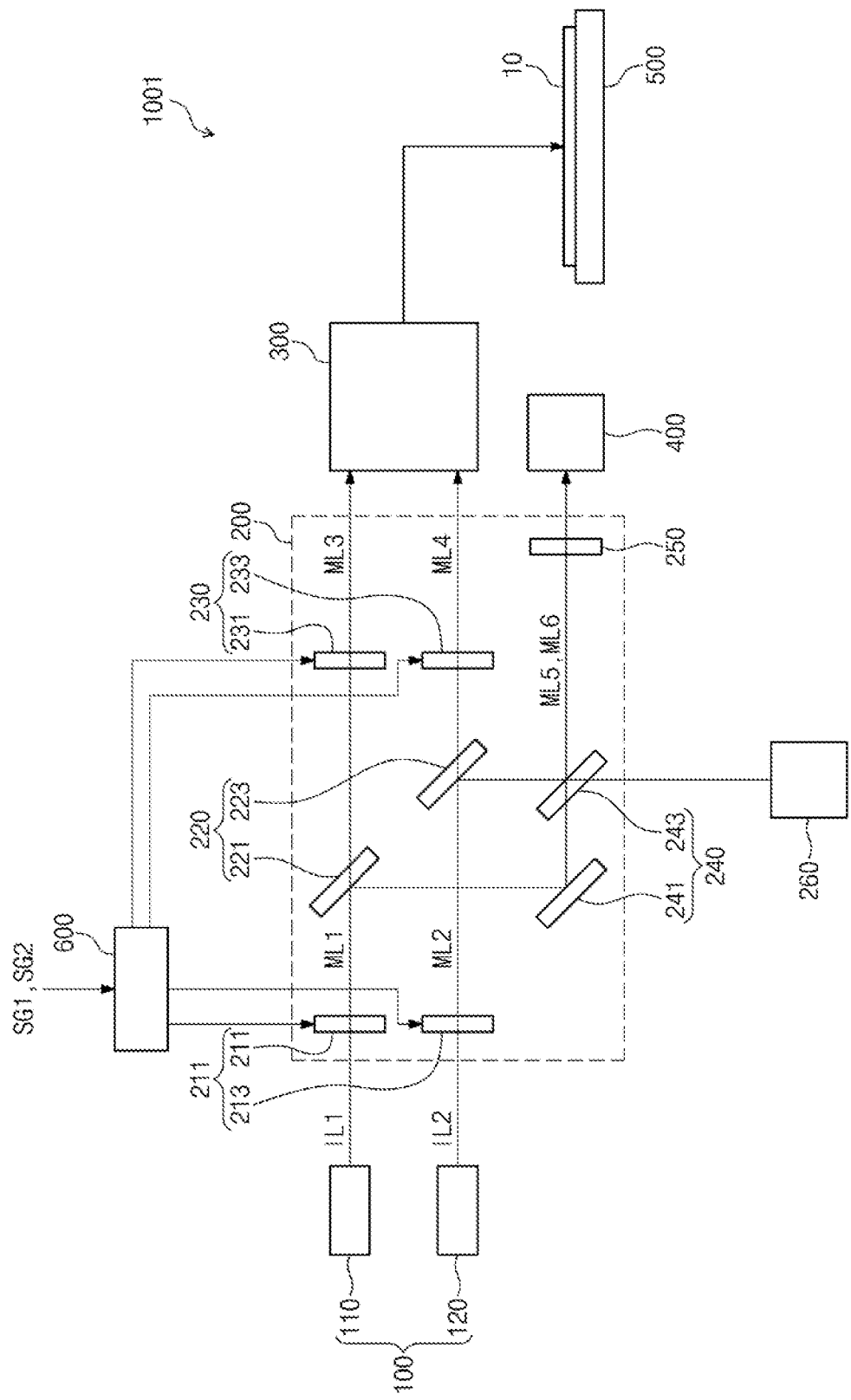
FIG. 6 is a schematic diagram illustrating a laser crystallizing apparatus according to an exemplary embodiment of the inventive concept.

FIG. 6 is a schematic diagram illustrating a laser crystallizing apparatus according to an exemplary embodiment of the inventive concept.

A laser crystallizing apparatus 1001 described with reference to FIG. 6 is substantially the same as the laser crystallizing apparatus 1000 described with reference to FIGS. 1 and 2 except that a rotational moving unit 600 is further provided.

The rotational moving unit 600 may receive a first signal SG1 and a second signal SG2.

The rotational moving unit 600 may rotate optical axes of a first input polarization rotator 211, a second input polarization rotator 213, a first output polarization rotator 231, and a second output polarization rotator 233 at an angle of about 90 degrees in a first direction according to the first signal SG1.

The rotational moving unit 600 may rotate optical axes of a first input polarization rotator 211, a second input polarization rotator 213, a first output polarization rotator 231, and a second output polarization rotator 233 at an angle of about 90 degrees in a second direction according to the second signal SG2.

The first direction and the second direction may be a clockwise direction and a counterclockwise direction, respectively, or vice versa. In the case of a half-wave plate, when it rotates at an angle of about 90 degrees in the first direction, it is the same as that rotating at angle of about 90 degrees in the counterclockwise direction. Thus, the second direction may be the clockwise or counterclockwise direction like the first direction.

In an exemplary embodiment of the inventive concept, an operation of the rotational moving unit 600 is set so that all first and second input light IL1 and IL2 emitted from a first light source unit 110 and a second light source unit 120 are P-polarized, and a polarization plate 250 transmits the P-polarized light therethrough. Initially, the optical axes of the first input polarization rotator 211 and the second input polarization rotator 213 may be disposed to be perpendicular to each other.

When the first signal SG1 is applied to the rotational moving unit 600, the first input light IL1 may be P-polarized after passing through the first input polarization rotator 211, and the second input light IL2 may be S-polarized after passing through the second input polarization rotator 213. Here, the light passing through the polarization plate 250 may be a portion of the first input light IL1. The monitoring unit 400 measures an $M^2$ factor of the first input light IL1.

When the second signal SG2 is applied to the rotational moving unit 600, the first input light IL1 may be S-polarized after passing through the first input polarization rotator 211, and the second input light IL2 may be P-polarized after passing through the second input polarization rotator 213. Here, the light passing through the polarization plate 250 may be a portion of the second input light IL2. The monitoring unit 400 measures an $M^2$ factor of the second input light IL2.

The first signal SG1 and the second signal SG2 may be alternately applied and may be applied to at a regular interval. Thus, the rotational moving unit 600 may periodically rotate the optical axes of the first input polarization rotator 211 and the second input polarization rotator 213.

Therefore, the laser crystallizing apparatus 1001 of FIG. 6 may alternately measure qualities of the first input light IL1 and the second input light IL2.

Figure 7:
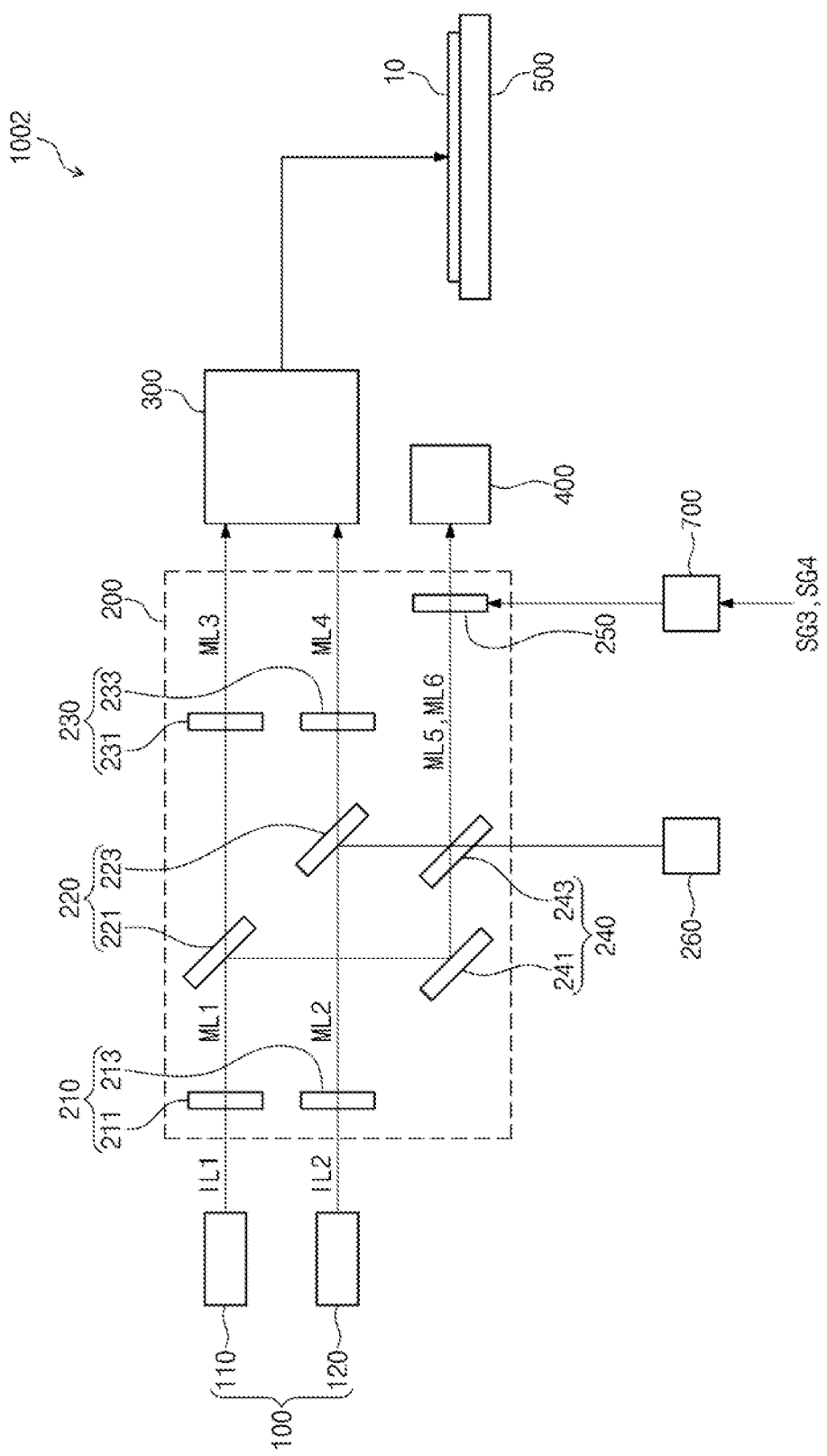
FIG. 7 is a schematic diagram illustrating a laser crystallizing apparatus according to an exemplary embodiment of the inventive concept.

FIG. 7 is a schematic diagram illustrating a laser crystallizing apparatus according to an embodiment of the inventive concept.

A laser crystallizing apparatus 1002 described with reference to FIG. 7 is substantially the same as the laser crystallizing apparatus 1000 described with reference to FIGS. 1 and 2 except that a polarization plate rotating moving unit 700 is further provided.

The polarization plate rotating moving unit 700 may receive a third signal SG3 and a fourth signal SG4.

The polarization plate rotating moving unit 700 may rotate an optical axis of the polarization plate 250 at an angle of about 90 degrees in the first direction according to the third signal SG3. The polarization plate rotating moving unit 700 may rotate the optical axis of the polarization plate 250 at an angle of about 90 degrees in the second direction according to the fourth signal SG4.

The first direction and the second direction may be a clockwise direction and a counterclockwise direction, respectively, or vice versa. In the case of a half-wave plate, when it rotates at an angle of about 90 degrees in the first direction, it is the same as that rotating at angle of about 90 degrees in the counterclockwise direction. Thus, the second direction may be the clockwise or counterclockwise direction like the first direction.

In an exemplary embodiment of the inventive concept, an operation of the rotational moving unit 700 is set so that all first and second input light IL1 and IL2 emitted from a first light source unit 110 and a second light source unit 120 are P-polarized, the first input polarization rotator 211 transmits the P-polarized light therethrough, and the second input polarization rotator 213 transmits the S-polarized light therethrough. When the third signal SG3 is applied to the polarization plate rotating moving unit 700, the polarization plate 250 transmits the P-polarized light therethrough, and when the fourth signal SG4 is applied, the polarization plate 250 transmits the S-polarized light therethrough.

When the third signal SG3 is applied to the polarization plate rotating moving unit 700, first middle light ML1 having the P-polarized state may be transmitted through the polarization plate 250 and then incident into the monitoring unit 400, and second middle light ML2 having the S-polarized state may be blocked by the polarization plate 250. The monitoring unit 400 measures an $M^2$ factor of a portion of the first input light IL1.

When the fourth signal SG4 is applied to the polarization plate rotating moving unit 700, the first middle light ML1 having the P-polarized state may be blocked by the polarization plate 250, and the second middle light ML2 having the S-polarized state may be transmitted through the polarization plate 250. The monitoring unit 400 measures an $M^2$ factor of a portion of the second input light IL2.

Figure 8:
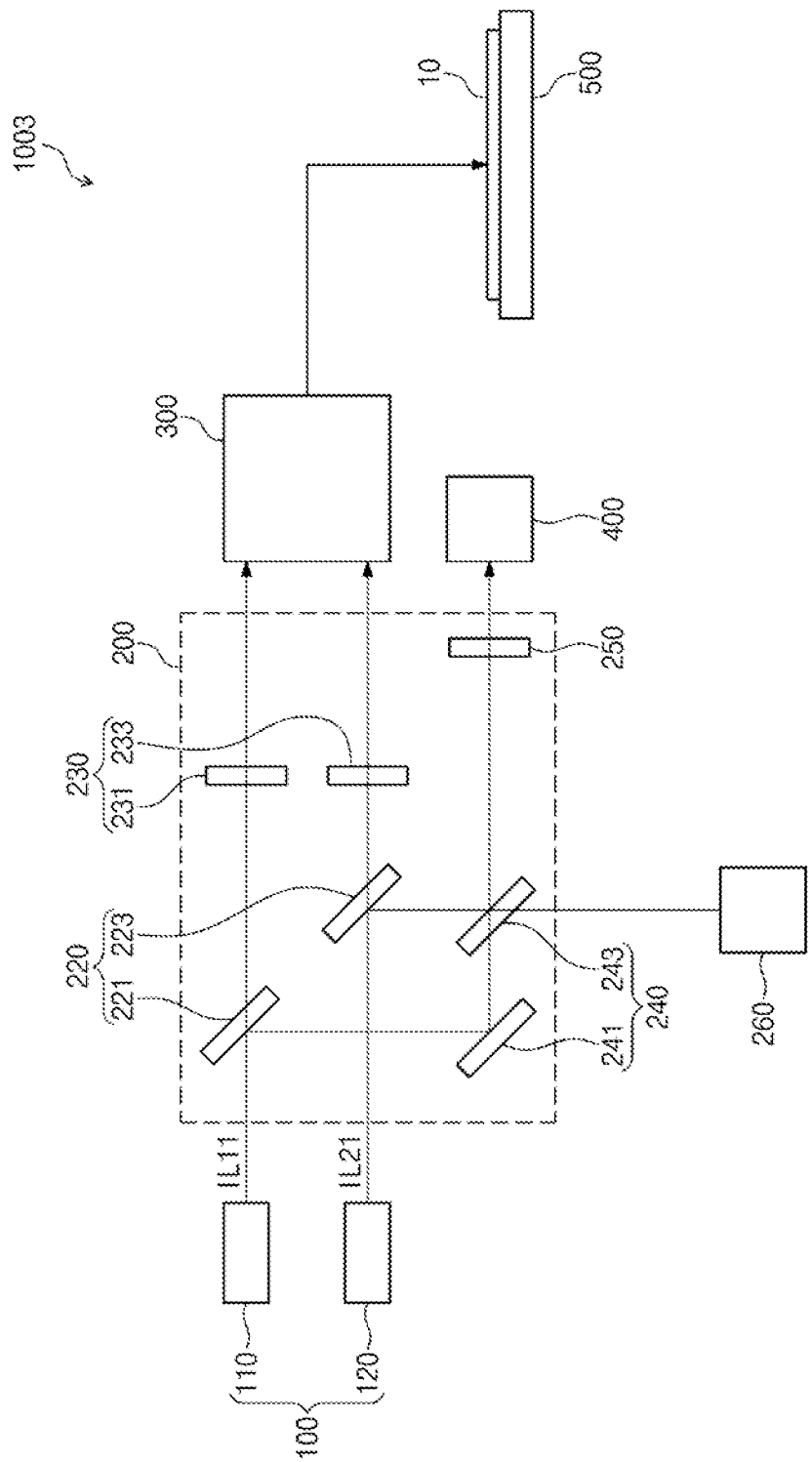
FIG. 8 is a schematic diagram illustrating a laser crystallizing apparatus according to an exemplary embodiment of the inventive concept.

FIG. 8 is a schematic diagram illustrating a laser crystallizing apparatus according to an exemplary embodiment of the inventive concept.

A laser crystallizing apparatus 1003 described with reference to FIG. 8 is substantially the same as the laser crystallizing apparatus 1000 described with reference to FIGS. 1 and 2 except that the input polarization rotator 210 is removed.

A first light source unit 110 and the second light source unit 120 may emit light having polarized states different from each other. For example, the first light source unit 110 may emit first input light IL11 that is P-polarized, and the second light source unit 120 may emit second input light IL22 that is S-polarized.

One of the first input light IL11 and the second input light IL22 may be blocked by the polarization plate 250, and the other one is incident into the monitoring unit 400. The monitoring unit 400 may calculate an $M^2$ factor of one of the first input light IL11 and the second input light IL22.

Optical axes of a first output polarization rotator 231 and a second output polarization rotator 233 may be perpendicular to each other. Thus, a polarized state of the first input light IL11 passing through the first output polarization rotator 231 and a polarized state of the second input light IL22 passing through the second output polarization rotator 233 may be the same.

According to an exemplary embodiment of the inventive concept, the laser crystallizing apparatus may manage the performance of the laser beam. In addition, when the plurality of laser light sources are provided, the performance of the laser beam for each laser light source may be managed.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A laser crystallizing apparatus comprising:
   a first light source unit configured to emit a first input light having a linearly polarized laser beam shape;
   a second light source unit configured to emit a second input light having a linearly polarized laser beam shape;
   a polarization optical system configured to rotate the first input light and/or the second input light at a predetermined rotation angle;
   an optical system configured to convert at least one of the first input light and the second input light, which pass through the polarization optical system, into an output light;
   a stage on which a target substrate is seated and onto which the output light is directed; and
   a monitoring unit configured to receive the first input light or the second input light from the polarization optical system and measure a laser beam quality thereof.

2. The laser crystallizing apparatus of claim 1, wherein the polarization optical system rotates the first input light or the second input light two times at the predetermined rotation angle.

3. The laser crystallizing apparatus of claim 1, wherein the predetermined rotation is about 90 degrees.

4. The laser crystallizing apparatus of claim 1, wherein each of the first light source unit and the second light source unit comprises a solid-state laser generator.

5. The laser crystallizing apparatus of claim 1, wherein the polarization optical system comprises:
   an input polarization rotator configured to rotate polarized light of the first input light and/or the second input light at the predetermined rotation angle;
   a beam splitter disposed behind the input polarization rotator on optical paths of the first input light and the second input light, the beam splitter being configured to transmit a first portion of each of the first input light and the second input light and reflect a second portion thereof;
   an output polarization rotator disposed behind the beam splitter on the optical paths of the first input light and the second input light to rotate the first and/or second input light, which are polarized, at the predetermined rotation angle; and
   a polarization plate configured to block one of, and transmit another of the second portion of the first input light reflected by the beam splitter and the second portion of the second input light reflected by the beam splitter.

6. The laser crystallizing apparatus of claim 5, wherein the first input light and the second input light have the same first polarized state.

7. The laser crystallizing apparatus of claim 5, wherein the input polarization rotator comprises:
   a first input polarization rotator configured to convert the first polarized state of the incident first input light into a second polarized state that is different from the first polarized state; and a second input polarization rotator configured to maintain the first polarized state of the incident first input light.

8. The laser crystallizing apparatus of claim 7, wherein the first input polarization rotator and the second input polarization rotator have optical axes that are perpendicular to each other or optical axes that have an angle of about 45 degrees therebetween.

9. The laser crystallizing apparatus of claim 7, wherein the beam splitter comprises:
a first beam splitter configured to reflect one of, and transmit another of, a portion of the first input light passing through the first input polarization rotator; and
a second beam splitter configured to reflect one of, and transmit another of, a portion of the second input light passing through the second polarization rotator.

10. The laser crystallizing apparatus of claim 9, wherein the output polarization rotator comprises:
a first output polarization rotator configured to convert the second polarized state of the first input light passing through the first beam splitter into the first polarized state; and
a second output polarization rotator configured to maintain the first polarized state of the second input light passing through the second beam splitter.

11. The laser crystallizing apparatus of claim 10, wherein the first output polarization rotator and the second output polarization rotator have optical axes that are perpendicular to each other or optical axes that have an angle of about 45 degrees therebetween.

12. The laser crystallizing apparatus of claim 5, wherein the monitoring unit comprises:
a focus lens configured to adjust an intensity of and a focus of sensing light passing through the polarization plate;
a plurality of sensor beam splitters spaced apart from each other on an optical path of the sensing light and configured to reflect one of, and transmit another of, a portion of the sensing light;
a plurality of image sensors, each of which is configured to measure a laser width of the sensing light that is reflected by each of the plurality of sensor beam splitters; and
a calculation unit configured to calculate a laser quality according to the laser width of the sensing light received from each of the plurality of image sensors.

13. The laser crystallizing apparatus of claim 12, wherein the plurality of sensor beam splitters are disposed at a same interval.

14. The laser crystallizing apparatus of claim 5, wherein the monitoring unit comprises:
a focus lens configured to adjust an intensity and a focus of sensing light passing through the polarization plate;
a moving image sensor configured to move along an optical path of the sensing light and measure a laser width of the sensing light; and
a calculation unit configured to calculate a laser quality according to the laser width of the sensing light received from the moving image sensor.

15. The laser crystallizing apparatus of claim 9, further comprising a rotational moving unit configured to receive a first signal and a second signal and thereby to rotate an optical axis of each of the first input polarization rotator, the second input polarization rotator, a first output polarization rotator, and a second output polarization rotator at an angle of about 90 degrees in a first direction according to the first signal and rotate the optical axis of each of the first input polarization rotator, the second input polarization rotator, the first output polarization rotator, and the second output polarization rotator at an angle of about 90 degrees in a second direction according to the second signal.

16. The laser crystallizing apparatus of claim 15, wherein the first signal and the second signal are alternately applied.

17. The laser crystallizing apparatus of claim 9, further comprising a polarization plate rotating moving unit configured to receive a third signal and a fourth signal and thereby to rotate an optical axis of the polarization plate at an angle of about 90 degrees in a first direction according to the third signal and rotate the optical axis at an angle of about 90 degrees in a second direction according to the fourth signal.

18. The laser crystallizing apparatus of claim 5, wherein the third signal and the fourth signal are alternately applied.

19. A laser crystallizing apparatus comprising:
a first light source unit configured to emit a first input light having a laser beam shape and a first polarized state;
a second light source unit configured to emit a second input light having a laser beam shape and the first polarized state;
a first input polarization rotator configured to convert the first input light into a second polarized state different from the first polarized state;
a second input polarization rotator configured to maintain the first polarized state of the second input light;
a first output polarization rotator configured to convert the second polarized state of the first input light passing through the first input polarization rotator into the first polarized state;
a second output polarization rotator configured to maintain the first polarized state of the second input light passing through the second input polarization rotator;
an optical system configured to convert the first input light and the second input light, which pass through the first and second output polarization rotators, into an output light;
a stage on which a target substrate is seated and onto which the output light is directed;
a polarization plate configured to block one of, and transmit another of, the first input light having the second polarized state, which passes through the first input polarization rotator, and the second input light having the first polarized state, which passes through the second input polarization rotator; and
a monitoring unit configured to measure a laser beam quality by using the light passing through the polarization plate.

20. The laser crystallizing apparatus of claim 19, wherein the laser beam quality comprises an $M^2$ factor.

* * * * *